United States Patent
Yang et al.

(10) Patent No.: US 12,169,367 B2
(45) Date of Patent: Dec. 17, 2024

(54) VERTICAL MOTION PROTECTION METHOD AND DEVICE BASED ON DUAL-STAGE MOTION SYSTEM OF PHOTOLITHOGRAPHY MACHINE

(71) Applicant: TSINGHUA UNIVERSITY, Beijing (CN)

(72) Inventors: Kaiming Yang, Beijing (CN); Rong Cheng, Beijing (CN); Yu Zhu, Beijing (CN); Ming Zhang, Beijing (CN); Sheng Lei, Beijing (CN); Tao Liu, Beijing (CN); Sen Lu, Beijing (CN); Xin Li, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 115 days.

(21) Appl. No.: 18/042,991

(22) PCT Filed: Mar. 4, 2021

(86) PCT No.: PCT/CN2021/079105
§ 371 (c)(1),
(2) Date: Feb. 24, 2023

(87) PCT Pub. No.: WO2022/041673
PCT Pub. Date: Mar. 3, 2022

(65) Prior Publication Data
US 2023/0359132 A1    Nov. 9, 2023

(30) Foreign Application Priority Data

Aug. 26, 2020 (CN) .......................... 202010870392.2

(51) Int. Cl.
*G03F 7/00* (2006.01)
(52) U.S. Cl.
CPC .............................. *G03F 7/70725* (2013.01)

(58) Field of Classification Search
CPC .......................... G03F 7/70725; G03F 7/70716
See application file for complete search history.

(56) References Cited

U.S. PATENT DOCUMENTS 6,963,122 B1    11/2005  Soenen et al.
9,798,252 B2 *  10/2017  Miyakawa .......... G03F 7/70725
(Continued)

FOREIGN PATENT DOCUMENTS

| CN | 102566287 A | 7/2012 |
| CN | 103383526 A | 11/2013 |

(Continued)

OTHER PUBLICATIONS

International Search Report from International Application No. PCT/CN2021/079105 mailed May 24, 2021.

*Primary Examiner* — Hung V Nguyen
(74) *Attorney, Agent, or Firm* — Shih IP Law Group, PLLC (57) ABSTRACT

Disclosed are a vertical motion protection method and device based on a dual-stage motion system of a photolithography machine. The method comprises: according to a distance between measured points and reference points of the eddy current sensor and coordinates of the reference points of the eddy current sensor, calculating coordinates of the measured points on a lower surface of the micro-motion stage respectively; calculating a point normal form equation of the micro-motion stage at the current time using measured coordinates of the measured points on the micro-motion stage, then substituting X and Y coordinates of the measured points on the translated micro-motion stage to determine a maximum height of the micro-motion stage at the current time; and comparing the maximum height with a height threshold, if the maximum height exceeds the height threshold, shutting down for protection, or else continuing to operate the system.

10 Claims, 3 Drawing Sheets

(56) References Cited

U.S. PATENT DOCUMENTS

| | | | |
|---|---|---|---|
| 11,067,894 B2* | 7/2021 | Shibazaki | G03F 7/70516 |
| 2006/0123888 A1 | 6/2006 | Galburt et al. | |
| 2019/0310547 A1 | 10/2019 | Kondo | |

FOREIGN PATENT DOCUMENTS

| | | |
|---|---|---|
| CN | 109976103 A | 7/2019 |
| CN | 111948917 A | 11/2020 |

* cited by examiner

VERTICAL MOTION PROTECTION METHOD AND DEVICE BASED ON DUAL-STAGE MOTION SYSTEM OF PHOTOLITHOGRAPHY MACHINE

TECHNICAL FIELD

The present disclosure relates to a technical field of semiconductor equipment, and in particular, to a vertical motion protection method and a vertical motion protection device based on a dual-stage motion system of a photolithography machine.

DESCRIPTION OF RELATED ART

A dual-stage of a photolithography machine carries a silicon wafer by the stage and performs exposure operations on the silicon wafer at different positions. The dual-stage includes a macro-motion stage and a micro-motion stage located above the macro-motion stage. The micro-motion stage carrying the silicon wafer has three degrees of freedom and can move in X, Y, and Z directions. In order to accomplish the exposure of the silicon wafer, an objective lens is installed above the micro-motion stage. During silicon wafer processing, the micro-motion stage may carry the silicon wafer to move in the X and Y directions at first to reach the exposure field, and then move in the Z direction to focus correctly. Due to the overshoot which might be occurred during the automatic control process, the micro-motion stage may move excessively in the Z direction during the focusing process and collide with the objective lens, causing damage to equipment.

SUMMARY

An object of the present disclosure is to provide a vertical motion protection algorithm based on a dual-stage motion system of a photolithography machine, in order to solve the problem that during the exposure process of the stage, the micro-motion stage may be overshot when moving in the Z direction, collide with the objective lens, and cause damage to the equipment.

The technical solution of the present disclosure is as follows:

A vertical motion protection method based on a dual-stage motion system of a photolithography machine, wherein the dual-stage motion system includes a macro-motion stage and a micro-motion stage located above the macro-motion stage, the macro-motion stage and the micro-motion stage have flat square shapes, and the vertical motion protection method includes:

establishing a space rectangular coordinate system O-XYZ, wherein an X-axis and a Y-axis are in horizontal directions by taking a point on an upper surface of the micro-motion stage at an initial position as an original point O, and a Z-axis is upward in a vertical direction, the micro-motion stage has three degrees of freedom in directions of the X-axis, the Y-axis and the Z-axis, wherein vertical displacement sensors are respectively disposed at four corners of a lower surface of the macro-motion stage, and the vertical displacement sensors are configured to measure vertical distances between a lower surface of the micro-motion stage and the macro-motion stage respectively, wherein a horizontal displacement measuring device is further provided for measuring displacements of the micro-motion stage in the directions of the X-axis and the Y-axis;

obtaining coordinates of measured points respectively according to data of the vertical displacement sensor and the horizontal displacement measuring device;

obtaining a point normal form equation f(X, Y, Z)=0 of the lower surface of the micro-motion stage in the space rectangular coordinate system O-XYZ by using the coordinates of the measured points;

taking a nearest corner point of a measured point corresponding to a maximum value $h_{max}$ among measured values of the measured points as a highest point on the lower surface of the micro-motion stage, and obtaining a Z-axis coordinate $h_b$ of the highest point on the lower surface of the micro-motion stage at the current time by using the point normal form equation f(X, Y, Z)=0; and obtaining a Z-axis coordinate $h_u$ of a highest point on the upper surface of the micro-motion stage according to the Z-axis coordinate $h_b$ of the highest point on the lower surface of the micro-motion stage, and comparing the $h_u$ with a height threshold, if the $h_u$ exceeds the height threshold, shutting down for protection, if the $h_u$ does not exceed the height threshold, continuing to operate the dual-stage motion system.

Preferably, after comparing the $h_u$ with the height threshold, if the $h_u$ does not exceed the height threshold, obtaining a difference between the Z-axis coordinate $h_u$ of the highest point on the upper surface of the micro-motion stage at the current time and the Z-axis coordinate $h_u$ of the highest point on the upper surface of the micro-motion stage at the previous time, dividing the difference by a sampling period to obtain an instantaneous speed v, and comparing the instantaneous speed with a speed threshold, if the instantaneous speed exceeds the speed threshold, shutting down for protection, if the instantaneous speed does not exceed the speed threshold, continuing to operate the dual-stage motion system.

Preferably, the original point O is located at a center of the upper surface of the micro-motion stage at the initial position, and the X-axis and Y-axis are parallel to a long side and a wide side of the macro-motion stage, respectively.

Preferably, the vertical displacement sensors are eddy current sensors.

Preferably, an equation for obtaining the Z-axis coordinate of the highest point on the upper surface of the micro-motion stage according to the Z-axis coordinate $h_b$ of the highest point on the lower surface of the micro-motion stage is as follows:

$$h_u = b \cdot \frac{n \cdot e_z}{|n|} + h_b$$

wherein $e_z$ is an unit vector in the Z-axis, b is a thickness of the micro-motion stage, and |n| is a norm.

Preferably, obtaining a point normal form equation f(X, Y, Z)=0 of the lower surface of the micro-motion stage in the space rectangular coordinate system O-XYZ by using the coordinates of the measured points includes:

generating a set of intersecting vectors $l_1$ and $l_2$ using the coordinates of the measured points so as to obtain a normal vector $n=l_1 \times l_2$ of the lower surface of the micro-motion stage, and then to obtain the point normal form equation f(X, Y, Z)=0 of the lower surface of the micro-motion stage in the space rectangular coordinate system O-XYZ.

Preferably, obtaining coordinates of measured points respectively and generating intersecting vectors includes:

reading data of the eddy current sensor and the horizontal displacement measuring device, and calculating coordinates $C_1$, $C_2$, $C_3$ and $C_4$ of the measured points according to distances $h_1$, $h_2$, $h_3$ and $h_4$ between the measured points and reference points of the eddy current sensor as well as coordinates $S_1$, $S_2$, $S_3$ and $S_4$ of the reference points of the eddy current sensor; and generating a set of intersecting vectors $l_1 = C_1 C_3$ and $l_2 = C_2 C_4$ using the coordinates of the measured points.

Preferably, the horizontal displacement measuring device is an optical grating scale and/or a capacitive grating scale.

Preferably, heat dissipation holes are uniformly distributed on the lower surface of the micro-motion stage, and sets of eddy current sensors are respectively disposed at four corners of the lower surface of the macro-motion stage, each set of the eddy current sensors includes two eddy current sensors, wherein a minimum distance measured in each set of the eddy current sensors is selected as a correct value, which is taken as a distance between the measured point and reference points of the eddy current sensor.

The present disclosure also provides a vertical motion protection device based on a dual-stage motion system of a photolithography machine, the dual-stage motion system includes a macro-motion stage and a micro-motion stage located above the macro-motion stage, the macro-motion stage and the micro-motion stage have flat square shapes, and the vertical motion protection device includes:

vertical displacement sensors disposed at four corners of a lower surface of the macro-motion stage respectively, and the vertical displacement sensors are configured to measure vertical distances between a lower surface of the micro-motion stage and the macro-motion stage respectively;

a horizontal displacement measuring device for measuring displacements of the micro-motion stage in directions of an X-axis and a Y-axis;

an acquisition module for acquiring coordinates of the lower surface of the micro-motion stage, establishing a space rectangular coordinate system O-XYZ by taking a point on an upper surface of the micro-motion stage at an initial position as an original point O, and calculating coordinates of measured points of the lower surface of the micro-motion stage respectively according to data of the vertical displacement sensor and the horizontal displacement measuring device, wherein the X-axis and the Y-axis are in horizontal directions, and a Z-axis is upward in a vertical direction;

an acquisition module for acquiring a Z-axis coordinate of a highest point on the lower surface of the micro-motion stage, obtaining a point normal form equation f(X, Y, Z)=0 of the lower surface of the micro-motion stage in the space rectangular coordinate system O-XYZ by using the coordinates of the measured points, and taking a nearest corner point of a measured point corresponding to a maximum value $h_{max}$ among measured values of the measured points as the highest point on the lower surface of the micro-motion stage, and obtaining a Z-axis coordinate $h_b$ of the highest point on the lower surface of the micro-motion stage at the current time by using the point normal form equation f(X, Y, Z)=0;

an acquisition module for acquiring a Z-axis coordinate of a highest point on the upper surface of the micro-motion stage, obtaining a Z-axis coordinate $h_u$ of the highest point on the upper surface of the micro-motion stage according to the Z-axis coordinate $h_b$ of the highest point on the lower surface of the micro-motion stage; and a comparison module for comparing the $h_u$ with a height threshold, if the $h_u$ exceeds the height threshold, shutting down for protection, if the $h_u$ does not exceed the height threshold, continuing to operate the dual-stage motion system.

According to the present disclosure, vertical coordinates located at the four corners of the lower surface of the micro-motion stage are detected by eddy current sensors arranged on the macro-motion stage, a point normal form equation of the lower surface of the micro-motion stage is constructed, and thus the coordinate of the highest point on the lower surface of the micro-motion stage is obtained, and according to an angle between the normal vector of the lower surface and the unit normal vector of the Z axis, the thickness of the micro-motion stage and the coordinate of the highest point on the lower surface of the micro-motion stage, the coordinate of the highest point on the upper surface of the micro-motion stage is obtained. According to the vertical motion protection method of the present disclosure, the data of the eddy current sensor and the horizontal displacement measuring device are used to calculate the height and speed of the micro-motion stage, so as to make real-time judgment on whether to shutdown, and to protect the system not be damaged when an accident occurs. The method reduces the complexity of the algorithm, is easy and simple to implement, and can ensure accuracy, thereby improving the real-time performance of the control system.

BRIEF DESCRIPTION OF DRAWINGS

The above-mentioned features and technical advantages of the present disclosure will become clearer and easier to be understood by describing the embodiments in conjunction with the following drawings.

DETAILED DESCRIPTIONS

Embodiments of the vertical motion protection method and the vertical motion protection device based on the dual-stage motion system of the photolithography machine according to the present disclosure will be described below with reference to the accompanying drawings. Those skilled in the art would recognize that the described embodiments can be modified in various ways or combinations thereof without departing from the spirit and scope of the invention. Therefore, the drawings and description are illustrative in nature and not intended to limit the protection scope of the claims. Further, in this specification, the drawings are not drawn to scale, and like reference numerals denote like parts.

Figure 1:
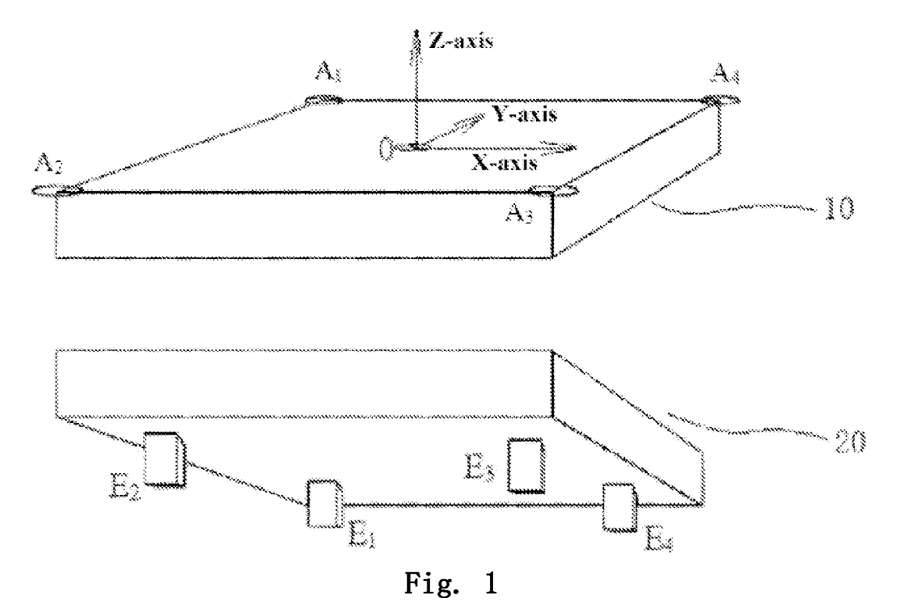
FIG. 1 is a schematic diagram showing positions of the macro-motion stage and the micro-motion stage according to the present disclosure.
Figure 2A:
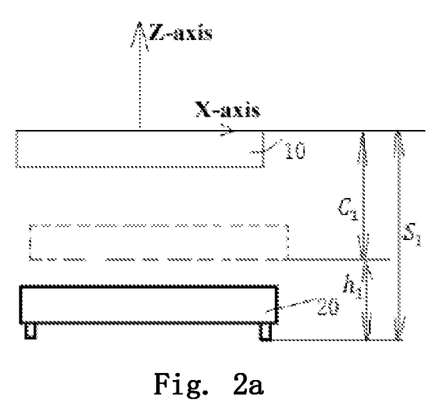
FIG. 2a is a schematic diagram showing the position of the micro-motion stage moving downward according to the present disclosure.
Figure 2B:
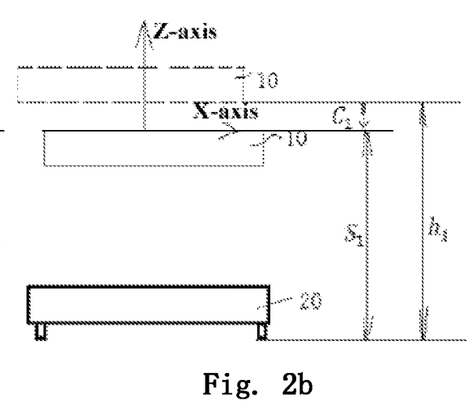
FIG. 2b is a schematic diagram showing the position of the micro-motion stage moving upward according to the present disclosure.
Figure 3:
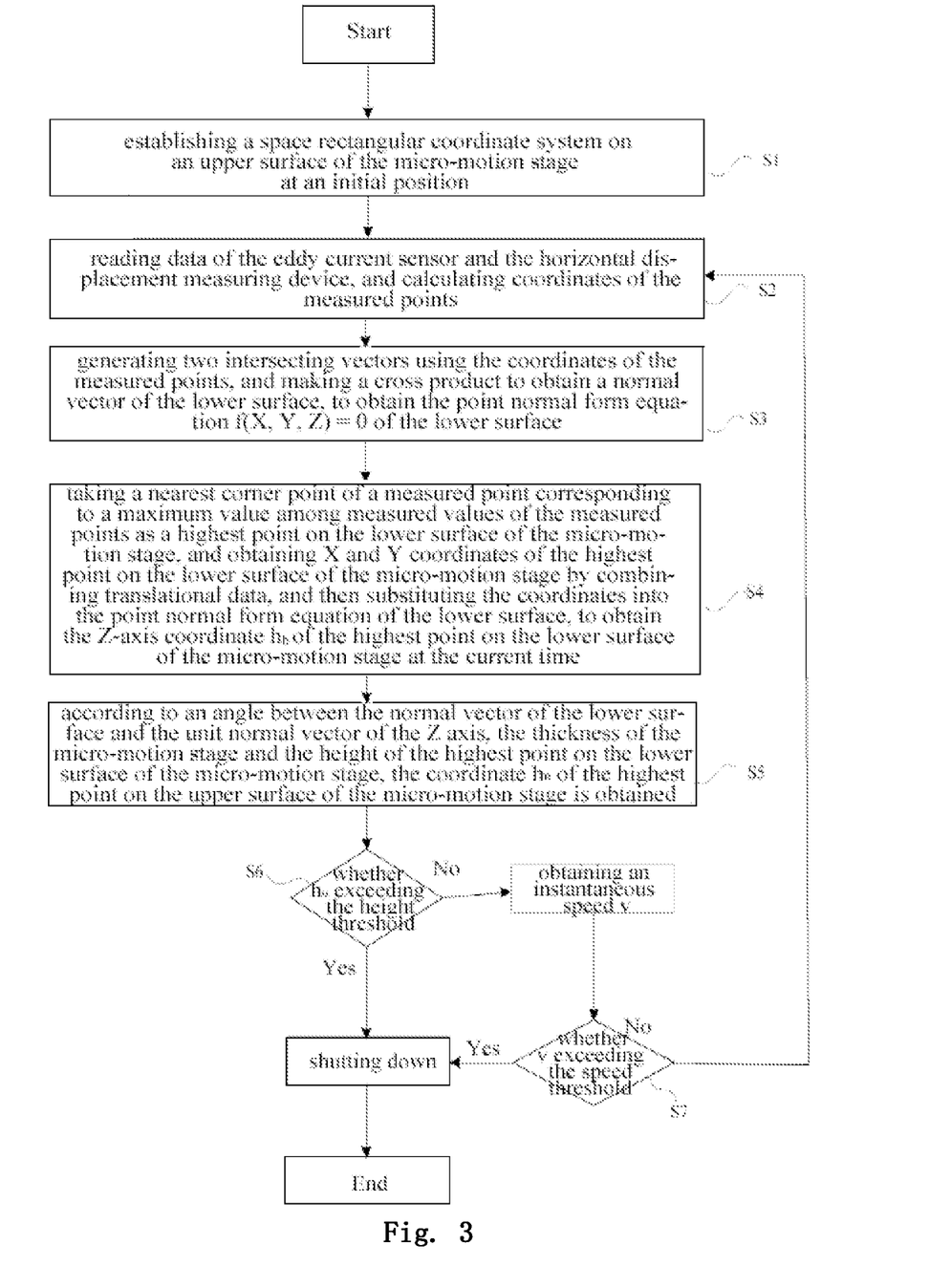
FIG. 3 is a flowchart showing steps of the vertical motion protection method of the present disclosure.

The present embodiment describes the vertical motion protection method based on the dual-stage motion system of the photolithography machine in conjunction with FIGS. 1-3. As shown in FIG. 1, the dual-stage motion system includes a macro-motion stage 20 and a micro-motion stage 10 located above the macro-motion stage 20, wherein the macro-motion stage and the micro-motion stage have flat square shapes. As shown in FIG. 1, during the movement process of the micro-motion stage 10, the highest point is one of the four corner points $A_1$, $A_2$, $A_3$ and $A_4$ on the upper surface thereof. To this end, in the embodiment, a coordinate of the highest point on the upper surface are obtained by monitoring and converting the highest point among the four corner points on the lower surface of the micro-motion stage.

The vertical motion protection method includes the following steps:

Step S1, establishing a space rectangular coordinate system O-XYZ, which may be a right-handed system by taking a center on an upper surface of the micro-motion stage at an initial position as an original point O wherein an X-axis and a Y-axis are in horizontal directions and are parallel to a long side and a wide side of the macro-motion stage, respectively, and a Z-axis is upward in a vertical direction. The micro-motion stage has three degrees of freedom in directions of the X-axis, the Y-axis and the Z-axis, for fine-tuning the position of the micro-motion stage.

Here, vertical displacement sensors, preferably, eddy current sensors, are respectively disposed at four corners of the lower surface of the macro-motion stage. As shown in FIG. 1, eddy current sensors $E_1$, $E_2$, $E_3$ and $E_4$ are respectively disposed at four corners of the lower surface of the macro-motion stage. In an initial state, the position coordinates of the four corners of the upper surface and the lower surface of the micro-motion stage, and the coordinates of the reference point of each eddy current sensor on the macro-motion stage are known.

The eddy current sensors are used to measure vertical distances between the lower surface of the micro-motion stage and the macro-motion stage respectively. A horizontal displacement measuring device for measuring displacements of the micro-motion stage in directions of the X-axis and the Y-axis is provided. Preferably, the horizontal displacement measuring device may be an optical grating scale and/or a capacitive grating scale.

Step S2, reading data of the eddy current sensor and the horizontal displacement measuring device, and calculating Z-axis coordinates $C_1$, $C_2$, $C_3$ and $C_4$ of measured points according to distances $h_1$, $h_2$, $h_3$ and $h_4$ between the measured points and reference points of the eddy current sensor as well as Z-axis coordinates $S_1$, $S_2$, $S_3$ and $S_4$ of the reference points of the eddy current sensor. As shown in FIGS. 2a and 2b, the frame with solid lines is the initial position of the micro-motion stage 10, the frame with dotted lines is the position of the micro-motion stage 10 after movement, and the frame with thick lines is the macro-motion stage 20. In FIG. 2a, $C_1=S_1-h_1$, and in FIG. 2b, $C_1=h_1-S_1$.

Step S3, generating a set of intersecting vectors $l_1=C_1C_3$ and $l_2=C_2C_4$ using coordinates of the measured points, so as to obtain a normal vector $n=l_1\times l_2$ of the lower surface of the micro-motion stage, and then to obtain the point normal form equation $f(X, Y, Z)=0$ of the lower surface of the micro-motion stage in the space rectangular coordinate system O-XYZ according to the normal vector n and the coordinate of any one measured point on the lower surface of the micro-motion stage.

For example, the normal vector $n=(p, q, t)$ and the coordinate of one measured point on the lower surface $(X_1, Y_1, C_1)$ are combined, thus, the point normal form equation $p(X-X_1)+q(Y-Y_1)+t(Z-C_1)=0$ is obtained, wherein $X_1$ and $Y_1$ are the coordinates of the X-axis and Y-axis corresponding to C1.

Step S4, taking a nearest corner point of a measured point corresponding to a maximum value $h_{max}=\max(h_1, h_2, h_3, h_4)$ among measured values of the measured points as a highest point on the lower surface of the micro-motion stage, and obtaining X and Y coordinates of the highest point on the lower surface of the micro-motion stage by combining translational data measured by the horizontal displacement measuring device, and then substituting the coordinates into the point normal form equation $f(X, Y, Z)=0$ to obtain the Z-axis coordinate of the highest point on the lower surface of the micro-motion stage at the current time, which is $h_b$. It should be noted that since the inversion and translation of the micro-motion stage 10 differ by a large magnitude, the change of the coordinates of the micro-motion stage caused by the inversion is not considered in the embodiment.

Step S5, obtaining a Z-axis coordinate of a highest point on the upper surface of the micro-motion stage at the current time according to the Z-axis coordinate $h_b$ of the highest point on the lower surface of the micro-motion stage, $$h_u = b \cdot \frac{n \cdot e_z}{|n|} + h_b$$

wherein $e_z$ is an unit vector in the Z-axis, b is a thickness of the micro-motion stage, and $|n|$ is a norm.

Step S6, comparing the $h_u$ with a height threshold, and if the $h_u$ exceeds the height threshold, shutting down for protection, if the $h_u$ does not exceed the height threshold, continuing to operate the dual-stage motion system.

Further, step S7 is also included after step S6, that is, obtaining a difference between the Z-axis coordinate of the highest point on the upper surface of the micro-motion stage at the current time and the Z-axis coordinate of the highest point on the upper surface of the micro-motion stage at the previous time, dividing the difference by a sampling period to obtain an instantaneous speed v, and comparing the instantaneous speed with a speed threshold, if the instantaneous speed exceeds the speed threshold, shutting down for protection, if the instantaneous speed does not exceed the speed threshold, continuing to operate the dual-stage motion system.

$$v=(h_u-h_{ub})/T$$

wherein T is the sampling period, and hub is the Z-axis coordinate of the highest point on the upper surface of the micro-motion stage at the previous time.

In an optional embodiment, heat dissipation holes are uniformly distributed on the lower surface of the micro-motion stage, and sets of eddy current sensors are respectively disposed at four corners of the lower surface of the macro-motion stage, each set of the eddy current sensors includes two eddy current sensors. At step S1, a minimum distance measured in the each set of the eddy current sensors is selected as a correct value, which is taken as a distance between the measured point and reference points of the eddy current sensor.

The present disclosure also provides a vertical motion protection device based on the dual-stage motion system of the photolithography machine, the dual-stage motion system includes a macro-motion stage and a micro-motion stage located above the macro-motion stage, wherein the vertical motion protection device includes:

eddy current sensors disposed on a lower surface of the macro-motion stage, the eddy current sensor are configured to measure vertical distances between a lower surface of the micro-motion stage and the macro-motion stage respectively;

a horizontal displacement measuring device for measuring displacements of the micro-motion stage in directions of an X-axis and a Y-axis;

an acquisition module for acquiring coordinates of the lower surface of the micro-motion stage, establishing a space rectangular coordinate system O-XYZ by taking a center on an upper surface of the micro-motion stage at an initial position as an original point O, reading the data of the eddy current sensor and the horizontal displacement measuring device, and calculating coordinates of measured points of the lower surface of the micro-motion stage respectively according to distances between the measured points and the reference points of the eddy current sensor and the coordinates of the reference points of the eddy current sensor, wherein the X-axis and the Y-axis are in a horizontal surface, and the Z-axis is upward in a vertical direction;

an acquisition module for acquiring a Z-axis coordinate of the highest point on the lower surface of the micro-motion stage, generating a set of intersecting vectors $l_1$ and $l_2$ using the coordinates of the measured points so as to obtain the normal vector $n=l_1 \times l_2$ of the lower surface of the micro-motion stage, and then to obtain the point normal form equation $f(X, Y, Z)=0$ of the lower surface of the micro-motion stage in the space rectangular coordinate system O-XYZ, and taking the measured point corresponding to the maximum value $h_{max}$ among the measured values of the measured points as the highest point on the lower surface of the micro-motion stage, and obtaining the X and Y coordinates of the highest point on the lower surface of the micro-motion stage by combining translational data measured by the horizontal displacement measuring device, and then substituting the coordinates into the point normal form equation $f(X, Y, Z)=0$ to obtain the Z-axis coordinate of the highest point on the lower surface of the micro-motion stage at the current time, which is $h_b$;

an acquisition module for acquiring a Z-axis coordinate of the highest point on the upper surface of the micro-motion stage, obtaining a Z-axis coordinate $h_u$ of the highest point on the upper surface of the micro-motion stage according to the Z-axis coordinate $h_b$ of the highest point on the lower surface of the micro-motion stage, $$h_u = b \cdot \frac{n \cdot e_z}{|n|} + h_b$$

wherein $e_z$ is an unit vector in the Z-axis, b is a thickness of the micro-motion stage, and $|n|$ is a norm; and a comparison module for comparing the $h_u$ with a height threshold, if the $h_u$ exceeds the height threshold, shutting down for protection, if the $h_u$ does not exceed the height threshold, continuing to operate the dual-stage motion system.

Further, the comparison module is also used to obtain a difference between the Z-axis coordinate $h_u$ of the highest point on the upper surface of the micro-motion stage at the current time and the Z-axis coordinate $h_u$ of the highest point on the upper surface of the micro-motion stage at the previous time, and divide the difference by a sampling period to obtain an instantaneous speed v, and compare the instantaneous speed v with a speed threshold, d if the instantaneous speed v exceeds the speed threshold, shutdown for protection, if the instantaneous speed does not exceed the speed threshold, the operation of the system continues.

The above are only preferred embodiments of the present disclosure, and are not intended to limit the present disclosure. For those skilled in the art, the present disclosure may have various modifications and changes. Any modifications, equivalent replacements, improvements, etc. made within the spirit and principles of the present disclosure shall be included within the protection scope of the present disclosure.

What is claimed is:

1. A vertical motion protection method based on a dual-stage motion system of a photolithography machine, wherein the dual-stage motion system comprises a macro-motion stage and a micro-motion stage located above the macro-motion stage, the macro-motion stage and the micro-motion stage have flat square shapes, and the vertical motion protection method comprises:

establishing a space rectangular coordinate system O-XYZ by taking a point on an upper surface of the micro-motion stage at an initial position as an original point O, wherein an X-axis and a Y-axis are in horizontal directions, and a Z-axis is upward in a vertical direction, the micro-motion stage has three degrees of freedom in directions of the X-axis, the Y-axis and the Z-axis, wherein vertical displacement sensors are respectively disposed at four corners of a lower surface of the macro-motion stage, and the vertical displacement sensors are configured to measure vertical distances between a lower surface of the micro-motion stage and the macro-motion stage respectively, wherein a horizontal displacement measuring device is further provided for measuring displacements of the micro-motion stage in the directions of the X-axis and the Y-axis;

obtaining coordinates of measured points respectively according to data of the vertical displacement sensor and the horizontal displacement measuring device;

obtaining a point normal form equation $f(X, Y, Z)=0$ of the lower surface of the micro-motion stage in the space rectangular coordinate system O-XYZ by using the coordinates of the measured points;

taking a nearest corner point of a measured point corresponding to a maximum value $h_{max}$ among measured values of the measured points as a highest point on the lower surface of the micro-motion stage, and obtaining a Z-axis coordinate $h_b$ of the highest point on the lower surface of the micro-motion stage at the current time by using the point normal form equation $f(X, Y, Z)=0$; and obtaining a Z-axis coordinate $h_u$ of a highest point on the upper surface of the micro-motion stage according to the Z-axis coordinate $h_b$ of the highest point on the lower surface of the micro-motion stage, and comparing the $h_u$ with a height threshold, if the $h_u$ exceeds the height threshold, shutting down for protection, if the $h_u$ does not exceed the height threshold, continuing to operate the dual-stage motion system.

2. The vertical motion protection method based on a dual-stage motion system of a photolithography machine of claim 1, wherein after comparing the $h_u$ with the height threshold, if the $h_u$ does not exceed the height threshold, obtaining a difference between the Z-axis coordinate $h_u$ of the highest point on the upper surface of the micro-motion stage at the current time and the Z-axis coordinate $h_u$ of the highest point on the upper surface of the micro-motion stage at the previous time, dividing the difference by a sampling period to obtain an instantaneous speed v, and comparing the instantaneous speed with a speed threshold, if the instantaneous speed exceeds the speed threshold, shutting down for protection, if the instantaneous speed does not exceed the speed threshold, continuing to operate the dual-stage motion system.

3. The vertical motion protection method based on a dual-stage motion system of a photolithography machine of claim 1, wherein the original point O is located at a center of the upper surface of the micro-motion stage at the initial position, and the X-axis and Y-axis are parallel to a long side and a wide side of the macro-motion stage, respectively.

4. The vertical motion protection method based on a dual-stage motion system of a photolithography machine of claim 1, wherein the vertical displacement sensors are eddy current sensors.

5. The vertical motion protection method based on a dual-stage motion system of a photolithography machine of claim 1, wherein an equation for obtaining the Z-axis coordinate of the highest point on the upper surface of the micro-motion stage according to the Z-axis coordinate $h_b$ of the highest point on the lower surface of the micro-motion stage is as follows:

$$h_u = b \cdot \frac{n \cdot e_z}{|n|} + h_b$$

wherein $e_z$ is an unit vector in the Z-axis, b is a thickness of the micro-motion stage, and $|n|$ is a norm.

6. The vertical motion protection method based on a dual-stage motion system of a photolithography machine of claim 1, wherein obtaining a point normal form equation $f(X, Y, Z)=0$ of the lower surface of the micro-motion stage in the space rectangular coordinate system O-XYZ by using the coordinates of the measured points comprises:

generating a set of intersecting vectors $l_1$ and $l_2$ using the coordinates of the measured points so as to obtain a normal vector $n=l_1 \times l_2$ of the lower surface of the micro-motion stage, and then to obtain the point normal form equation $f(X, Y, Z)=0$ of the lower surface of the micro-motion stage in the space rectangular coordinate system O-XYZ.

7. The vertical motion protection method based on a dual-stage motion system of a photolithography machine of claim 4, wherein obtaining coordinates of measured points respectively and generating intersecting vectors comprises:

reading data of the eddy current sensor and the horizontal displacement measuring device, and calculating coordinates $C_1$, $C_2$, $C_3$ and $C_4$ of the measured points according to distances $h_1$, $h_2$, $h_3$ and $h_4$ between the measured points and reference points of the eddy current sensor as well as coordinates $S_1$, $S_2$, $S_3$ and $S_4$ of the reference points of the eddy current sensor; and generating a set of intersecting vectors $l_1=C_1C_3$ and $l_2=C_2C_4$ using the coordinates of the measured points.

8. The vertical motion protection method based on a dual-stage motion system of a photolithography machine of claim 1, wherein the horizontal displacement measuring device is an optical grating scale and/or a capacitive grating scale.

9. The vertical motion protection method based on a dual-stage motion system of a photolithography machine of claim 4, wherein heat dissipation holes are uniformly distributed on the lower surface of the micro-motion stage, and sets of eddy current sensors are respectively disposed at four corners of the lower surface of the macro-motion stage, each set of the eddy current sensors comprises two eddy current sensors, wherein a minimum distance measured in each set of the eddy current sensors is selected as a correct value, which is taken as a distance between the measured point and reference points of the eddy current sensor.

10. A vertical motion protection device based on a dual-stage motion system of a photolithography machine, wherein the dual-stage motion system comprises a macro-motion stage and a micro-motion stage located above the macro-motion stage, the macro-motion stage and the micro-motion stage have flat square shapes, and the vertical motion protection device comprises:

vertical displacement sensors disposed at four corners of a lower surface of the macro-motion stage respectively, and the vertical displacement sensor are configured to measure vertical distances between a lower surface of the micro-motion stage and the macro-motion stage respectively;

a horizontal displacement measuring device for measuring displacements of the micro-motion stage in directions of an X-axis and a Y-axis;

an acquisition module for acquiring coordinates of the lower surface of the micro-motion stage, establishing a space rectangular coordinate system O-XYZ by taking a point on an upper surface of the micro-motion stage at an initial position as an original point O, and calculating coordinates of measured points of the lower surface of the micro-motion stage respectively according to data of the vertical displacement sensor and the horizontal displacement measuring device, wherein the X-axis and the Y-axis are in horizontal directions, and a Z-axis is upward in a vertical direction;

an acquisition module for acquiring a Z-axis coordinate of a highest point on the lower surface of the micro-motion stage, obtaining a point normal form equation $f(X, Y, Z)=0$ of the lower surface of the micro-motion stage in the space rectangular coordinate system O-XYZ by using the coordinates of the measured points, and taking a nearest corner point of a measured point corresponding to a maximum value $h_{max}$ among measured values of the measured points as the highest point on the lower surface of the micro-motion stage, and obtaining a Z-axis coordinate $h_b$ of the highest point on the lower surface of the micro-motion stage at the current time by using the point normal form equation $f(X, Y, Z)=0$;

an acquisition module for acquiring a Z-axis coordinate of a highest point on the upper surface of the micro-motion stage, obtaining a Z-axis coordinate $h_u$ of the highest point on the upper surface of the micro-motion stage according to the Z-axis coordinate $h_b$ of the highest point on the lower surface of the micro-motion stage; and a comparison module for comparing the $h_u$ with a height threshold, if the $h_u$ exceeds the height threshold, shutting down for protection, if the $h_u$ does not exceed the height threshold, continuing to operate the dual-stage motion system.

* * * * *